United States Patent
Abel et al.

(10) Patent No.: US 9,337,265 B2
(45) Date of Patent: May 10, 2016

(54) COMPOUND SEMICONDUCTOR STRUCTURE

(71) Applicant: GLOBALFOUNDRIES INC., Grand Cayman (KY)

(72) Inventors: Stefan Abel, Mering (DE); Lukas Czornomaz, Zurich (CH); Jean Fompeyrine, Waedenswil (CH); Mario El Kazzi, Zurich (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/467,660

(22) Filed: Aug. 25, 2014

(65) Prior Publication Data

US 2015/0061078 A1  Mar. 5, 2015

(30) Foreign Application Priority Data

Aug. 27, 2013 (GB) .................................. 1315208.7

(51) Int. Cl.
  *H01L 29/06* (2006.01)
  *H01L 29/267* (2006.01)
  (Continued)

(52) U.S. Cl.
  CPC ...... *H01L 29/0684* (2013.01); *H01L 21/02373* (2013.01); *H01L 21/02381* (2013.01);
  (Continued)

(58) Field of Classification Search
  CPC .................. H01L 21/02433; H01L 21/02373; H01L 21/02488; H01L 21/02521
  USPC ......................................................... 257/618
  See application file for complete search history.

(56) References Cited

U.S. PATENT DOCUMENTS

| | | |
|---|---|---|
| 6,287,710 B1 | 9/2001 | McKee et al. |
| 6,673,667 B2 | 1/2004 | Gorrell et al. |

(Continued)

FOREIGN PATENT DOCUMENTS

| | | |
|---|---|---|
| GB | 1315207.7 | 8/2013 |
| JP | 63192227 A | 8/1988 |

(Continued)

OTHER PUBLICATIONS

Application No. GB920130034BG1; Search Report under Section 17(5); Completed Jan. 27, 2014.

(Continued)

*Primary Examiner* — Douglas Menz
(74) *Attorney, Agent, or Firm* — Scully Scott Murphy and Presser

(57) ABSTRACT

A semiconductor structure comprises a substrate comprising a first crystalline semiconductor material, a dielectric layer, above the substrate, defining an opening, a second crystalline semiconductor material at least partially filling the opening, and a crystalline interlayer between the substrate and the second crystalline semiconductor material. The first crystalline semiconductor material and the second crystalline semiconductor material are lattice mismatched, and the crystalline interlayer comprises an oxygen compound. A method for fabricating semiconductor structure comprises the steps of providing a substrate including a first crystalline semiconductor material, patterning an opening in a dielectric layer above the substrate, the opening having a bottom, forming a crystalline interlayer on the substrate at least partially covering the bottom, and growing a second crystalline semiconductor material on the crystalline interlayer thereby at least partially filling the opening. The crystalline semiconductor materials are lattice mismatched, and the crystalline interlayer comprises an oxygen compound.

15 Claims, 2 Drawing Sheets

(51) Int. Cl.
  *H01L 29/165* (2006.01)
  *H01L 21/02* (2006.01)
  *H01L 21/8258* (2006.01)

(52) U.S. Cl.
  CPC .... *H01L21/02488* (2013.01); *H01L 21/02521* (2013.01); *H01L 21/02546* (2013.01); *H01L 21/02642* (2013.01); *H01L 21/8258* (2013.01); *H01L 29/165* (2013.01); *H01L 29/267* (2013.01)

(56) References Cited

U.S. PATENT DOCUMENTS

| | | |
|---|---|---|
| 7,833,849 B2 | 11/2010 | Callegari et al. |
| 8,173,551 B2 | 5/2012 | Bai et al. |
| 8,389,995 B2 | 3/2013 | Saint-Girons et al. |
| 2002/0153524 A1 | 10/2002 | Yu et al. |
| 2003/0057438 A1* | 3/2003 | Yu et al. ......... 257/190 |
| 2009/0039361 A1 | 2/2009 | Li et al. |
| 2012/0032163 A1 | 2/2012 | Yamazaki |
| 2012/0241734 A1 | 9/2012 | Honda et al. |

FOREIGN PATENT DOCUMENTS

| | | |
|---|---|---|
| JP | 20022314072 A | 10/2002 |
| WO | 0209150 A2 | 1/2002 |
| WO | 0209150 A3 | 1/2002 |
| WO | 2006125040 A2 | 11/2006 |
| WO | 2006125040 A3 | 11/2006 |

OTHER PUBLICATIONS

Marcus, et al.; "Passivation of Metals and Semiconductors, and Properties of Thin Oxide Layers, 1st Edition"; A Selection of Papers from the 9th International Symposium, Paris, France, Jun. 27-Jul. 1, 2005; pp. 215.

* cited by examiner

COMPOUND SEMICONDUCTOR STRUCTURE

CROSS-REFERENCE TO RELATED PATENT APPLICATION(S)

Pursuant to 35 U.S.C. §119, the present application claims priority to United Kingdom Application No. 1315208.7, filed Aug. 27, 2013, the entire contents of which are incorporated herein by reference.

BACKGROUND OF THE INVENTION

This disclosure relates to a semiconductor structure, and more particularly to a semiconductor structure including crystalline compound semiconductor material grown on a crystalline semiconductor substrate wherein the compound semiconductor material and the substrate semiconductor material are lattice mismatched. This disclosure also provides a method of fabricating such a semiconductor structure.

Silicon is the basic material for present solid-state electronics, and processing techniques have been evolved for decennials. Hence, most electronic integrated circuit devices are based on silicon. However, the relatively low charge carrier mobility and its indirect band gap are disadvantages and limit the use of silicon in particular in opto-electronic applications.

A monolithic integration of compound semiconductors on silicon wafers is desirable and has extensively been investigated in the past. Several problems need to be overcome when compound semiconductors and conventional silicon technologies are to be combined. First, there is a large lattice mismatch between a crystalline silicon substrate and compound semiconductor crystals. Further, there is a thermal expansion coefficient mismatch between the (silicon) wafer material and the active compound semiconductor material. Additionally, a structural mismatch between diamond-like structures and zincblende structures may occur. It is an overall goal to achieve high crystalline quality over various monolithic layers for compound semiconductor on a foreign substrate such as silicon.

In an effort to achieve high crystalline quality in crystalline material layers that show a lattice mismatch, several methods have been developed. For example, direct epitaxy of blanket layers allow for a gradual transition from one lattice parameter to the next. However, relatively thick transition layers are needed to reduce the defect density considerably.

In US 2002/0153524 A1, a crystalline silicon substrate is provided with a perovskite stack comprising perovskite oxide materials. On the top of the stack, a crystalline material having a lattice mismatch with the substrate material is deposited. At the interface between the perovskite stack and the substrate, a strain relaxation occurs which reduces defects in the top compound material.

Other techniques to combine compound semiconductor materials with conventional silicon wafers include bonding techniques. In direct wafer bonding, a compound hetero structure is fabricated on a donor wafer wherein the donor wafer material is eliminated after bonding with the conventional silicon wafer. This makes the bonding technology relatively expensive. Further, bonding is limited to the size of costly compound substrate wafers.

Another approach for combining lattice-mismatched materials, such as compound semiconductors with silicon substrates, is the aspect ratio trapping approach. Aspect ratio trapping (ART) refers to a technique where crystalline defects are terminated at non-crystalline, for example, dielectric sidewalls. U.S. Pat. No. 8,173,551 B2 discloses a method where a silicon substrate is covered with a dielectric layer defining trenches through to the substrate material. In the trenches, epitaxial films of a compound material are deposited wherein particular geometries of the growth front are realized. The aspect ratio of the trenches needs to be large enough to terminate the defects that nucleate at the silicon-compound interface so that higher parts of the crystalline compound show a low crystalline defect density. Some approaches of the ART technique teach the use of Germanium microcrystals grown in silicon oxide trenches on a silicon substrate with a gallium arsenide film on top.

SUMMARY

Embodiments of the present invention include semiconductor structure, a wafer structure comprising the semiconductor structure, and a method for fabricating the semiconductor structure. A semiconductor structure comprises a substrate, a dielectric layer, a second crystalline semiconductor material, and a crystalline interlayer. The substrate comprises a first crystalline semiconductor material. The dielectric layer is located above the substrate and defines an open. The second crystalline semiconductor material at least partially fills the opening. The crystalline interlayer is between the substrate and the second crystalline semiconductor material. The first crystalline semiconductor material and the second crystalline semiconductor material are lattice mismatched. The crystalline interlayer comprises an oxygen compound.

DETAILED DESCRIPTION

Figure 1:
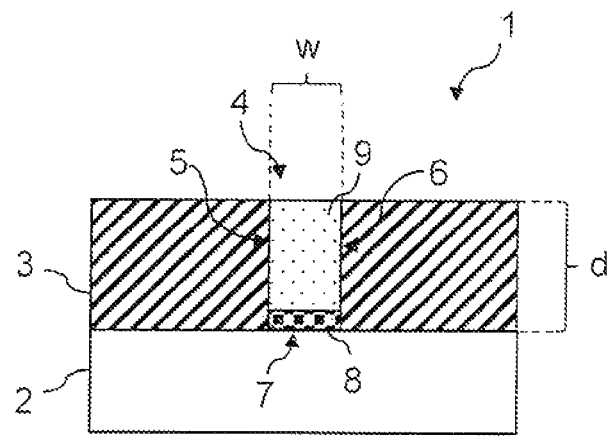
FIG. 1 shows a schematic diagram of a first embodiment of a semiconductor structure.

Silicon is the basic material for present solid-state electronics, and processing techniques have been evolved for decennials. Hence, most electronic integrated circuit devices are based on silicon. However, the relatively low charge carrier mobility and its indirect band gap are disadvantages and limit the use of silicon in particular in opto-electronic applications. It would be advantageous to combine more suitable semiconductor materials, such as III-V or IV-IV compound semiconductors, with silicon-based electronics on common silicon substrates.

It is, therefore, desirable to provide improved devices comprising lattice mismatched crystalline semiconductor materials and methods for fabricating such.

It is an aspect of the present disclosure to provide improved semiconductor structures based on a crystalline semiconductor material grown on a crystalline semiconductor substrate wherein the semiconductor material and the substrate semiconductor material have a lattice mismatch. The semiconductor material is in particular suitable for implementing further devices. Other aspects relate to improved methods for fabricating such a semiconductor structure.

Accordingly, an embodiment of a first aspect of the invention relates to a semiconductor structure comprising a substrate, a dielectric layer, a second crystalline semiconductor material, and a crystalline interlayer. The substrate comprises a first crystalline semiconductor material. The dielectric layer is above the substrate defining an opening. The second crystalline semiconductor material at least partially fills the opening. The crystalline interlayer is between the substrate and the second crystalline semiconductor material. The first crystalline semiconductor material and the second crystalline semiconductor material are lattice-mismatched. The crystalline interlayer comprises an oxygen compound.

The semiconductor structure may comprise two different types of crystalline semiconductor materials and provides a crystalline system suitable for further processing, for example, for realizing electronic devices. Some problems incurring with lattice-mismatched semiconducting materials are overcome by having the crystalline interlayer that comprises an oxygen compound. For example, oxides can be used as crystalline interlayer materials.

Typically, developing defects at the interface between the first and second crystalline semiconductor material are directed towards the opening defining sidewalls in the dielectric layer. By providing oxygen-comprising interlayers at the bottom of the opening, a specific growth of the second crystalline semiconductor material in the opening occurs. The specific growth that may proceed through island formation in a Volmer-Weber growth mode leads to less defects and a propagation of the defects only close to the bottom of the opening. The structural relationship between the oxide layer and the compound semiconductor layer might also favor the reduction of interfacial defects when compared to group IV and III-V.

The crystalline interlayer may comprise several functional layers. For example, the crystalline interlayer may include a stack of layers.

Embodiments of the semiconductor structure include a crystalline material of a first semiconductor material acting as a substrate with a foreign semiconductor material for forming active components. The proposed semiconductor structure shows low defect densities preferably below $10^7/cm^2$.

In embodiments of the semiconductor structure, the dielectric layer covers the substrate at least partially. For example, the dielectric layer is placed where the openings are defined. Similarly, the crystalline interlayer covers at least partially the substrate where the openings are defined. Hence, in the opening, an epitaxial growth of the second crystalline semiconductor material is performed.

Embodiments of the semiconductor structure comprise a crystalline interlayer that is a crystalline oxide layer. The crystalline oxide layer enhances the epitaxial growth of the second semiconductor material through islands in a Volmer-Weber growth mode because of its poor wettability. Structural defect densities then occur where the islands coalesce with each other, and the defect density decreases with the thickness or height of the second semiconductor material in the opening.

For example, the semiconductor structure may have an opening that comprises sidewalls and a bottom, wherein the bottom corresponds to a surface of the substrate. Preferably, the bottom is then covered with the crystalline interlayer material comprising an oxygen compound.

The opening may be a trench. Further, a plurality of trenches or openings can be provided so that crystalline regions are produced where a foreign semiconductor material, as for example a compound semiconductor material, is placed above a conventional semiconductor substrate.

In embodiments of the semiconductor structure, the sidewalls of the openings are non-crystalline. In particular, an amorphous material can be used.

In embodiments of the semiconductor structure, an aspect ratio of the depth to the width of the opening is at least one. In preferred embodiments, the aspect ratio is at least two and in particularly preferred embodiments, the aspect ratio is larger than three. Generally, the density of crystalline defects propagating from the bottom of the opening upwards decreases. The defects decrease in the growth direction of the second semiconductor material as defects may terminate at the sidewalls and are directed in a lateral direction with respect to the growth direction.

In embodiments, the crystalline interlayer is a diffusion barrier layer. For example, certain crystalline oxides function as diffusion barrier layers in addition to enhancing the nucleation of islands when growing the second semiconductor material. In embodiments, the crystalline interlayer has metallic conductivity. In embodiments, the semiconductor structure may comprise crystalline interlayers that are ferroelectric.

Generally, the crystalline interlayer can include several layers or a stack forming the crystalline interlayer. In embodiments, the crystalline interlayer may include a metallic component, an insulating component, a ferroelectric component, a piezoelectric component, and/or a ferromagnetic component. Hence, the interlayer can be a multilayer structure. One can contemplate of other functional properties of the crystalline interlayer.

Preferably, the crystalline interlayer may separate neighboring trenches or openings on a common the substrate electrically, i.e., the crystalline interlayer includes an insulating (sub-) layer. Further, the crystalline interlayer may prevent substrate material from diffusing into the eventually grown second crystalline semiconductor material, i.e., the crystalline interlayer includes a diffusion barrier (sub-) layer.

In embodiments of the semiconductor structure, the substrate comprises a first crystalline semiconductor material including a silicon substrate oriented along the (001) direction.

Further, a wafer structure comprising a plurality of semiconductor structures as mentioned before is proposed. For example, a wafer can comprise a plurality of trenches which are overgrown with compound semiconductor material wherein the interface between the wafer material and the epitaxial overgrown compound material is at least partially given by a crystalline oxide material.

According to an embodiment of another aspect of the invention, a method for fabricating a semiconductor structure is disclosed. Embodiments of the method comprise the steps of providing a substance, defining an opening, forming a crystalline interlayer, and growing a second crystalline semiconductor material. The substrate provided includes a first crystalline semiconductor material. The opening is definite in a dielectric layer above the substrate and the opening has a bottom. The crystalline interlayer is formed on the substrate and at least partially covers the bottom. The second crystalline semiconductor material is grown on the crystalline interlayer, thereby at least partially filling the opening. The first crystalline semiconductor material and the second crystalline semiconductor material are lattice-mismatched. The crystalline interlayer comprises an oxygen compound.

In particular, the fabricated semiconductor structure displays features and aspects as explained with respect to the embodiments of the semiconductor structure above.

The proposed method for fabricating a semiconductor structure can be implemented employing conventional semiconductor technologies. Also aspects of the ART technique can be employed.

Embodiments of the method comprise the additional step of forming the dielectric layer on the substrate. For example, the substrate may be provided in terms of a wafer, and the dielectric layer is deposited or generated through conventional techniques.

The method may further comprise the step of forming the dielectric layer on the crystalline interlayer. The sequence of the above-mentioned method steps can be adopted accordingly. One may first form the crystalline interlayer and then deposit the dielectric layer prior to defining the openings or trenches. However, one may as well first form trenches in the dielectric, amorphous layer wherein the trenches reach the substrate material and after that form the crystalline interlayer.

For example, an opening is defined in the dielectric layer, thereby forming sidewalls of the opening. The method may also comprise providing or forming a plurality of openings in the form of trenches. The step of defining the opening can be performed after forming the crystalline interlayer.

In embodiments of the method, growing the second crystalline semiconductor material on the crystalline interlayer comprises forming islands of said second crystalline semiconductor material on the crystalline interlayer. As an example, the growth of the second crystalline semiconductor material may occur according to a Volmer-Weber growth mode due to the poor wettability of the surface of the crystalline interlayer comprising oxygen. Then, the method may further comprise coalescing the islands, thereby forming an epitaxial film of the second crystalline semiconductor material.

The method may be adapted to form only one single island per opening or trench in the step of growing a second crystalline semiconductor material on the crystalline interlayer, e.g., the dimension of the opening can be realized accordingly. Reducing the number of islands that potentially merge decreases the number of defects due to the coalescence of islands.

In embodiments of the method, the step of overgrowing the opening with the second crystalline semiconductor material, thereby filing the opening, is performed.

The method may also comprise the step: after filling the opening with the second crystalline semiconductor material, planarizing overgrown second semiconductor material.

Optionally, the method may comprise further processing the second crystalline semiconductor material for fabricating electronic or optical devices.

For example, an embodiment of a semiconductor structure comprises a semiconductor substrate, an amorphous layer at least partially covering the substrate, and at least one opening formed in the amorphous layer. The opening has side walls and a bottom. The bottom of the opening is at least partially covered with a crystalline oxide layer. A compound semiconductor material is in the opening on the crystalline oxide layer.

An embodiment of a method for forming this embodiment of a semiconductor structure may comprise the steps of providing a semiconductor substrate, forming an amorphous layer at least partially covering the substrate, and defining at least one opening in the amorphous layer. The opening has side walls and a bottom. At least part of the bottom of the opening is covered with a crystalline oxide layer. A compound semiconductor material is applied in the opening on the crystalline oxide layer.

The compound semiconductor material of the channel region preferably includes a III-V compound semiconductor material, a II-VI compound semiconductor material, and/or a IV-IV compound semiconductor material. For example, the compound semiconductor material is $In_x(Ga,Al)_{(1-x)}As$ where $0<x<1$, InP, GaP, InSb, GaSb, ZnSe, CdTe, SiC, SiGe and/or GaN. In particular, InGaAs and/or GaAs has a higher carrier mobility than silicon and allows for fast semiconductor devices.

In some embodiments of the semiconductor structure, the compound semiconductor material is replaced by germanium (Ge). Although, Ge is strictly not a compound semiconductor, the disclosed features for a semiconductor structure and the methods may also hold for Ge-based devices.

Certain embodiments of the presented semiconductor structure and the method for fabricating a semiconductor structure may comprise individual or combined features, method steps, or aspects as mentioned above or below with respect to exemplary embodiments.

FIG. 1 shows a schematic diagram of an embodiment of a semiconductor structure 1. The general semiconductor structure 1 can be part of a semiconductor device or an integrated circuit chip. The semiconductor structure 1 comprises a crystalline substrate 2, a dielectric layer 3 with an opening 4 having sidewalls 5, 6 and a bottom 7. The bottom 7 is covered with a crystalline interlayer 8 comprising an oxygen compound. The opening 4 is filled with a second crystalline semiconductor material 9 that is lattice mismatched to the semiconductor material of the crystalline substrate 2.

The crystalline substrate 2, for example, is a crystalline semiconductor or a compound semiconductor wafer of a large diameter. The wafer can be, for example, a material from group IV of the periodic table. Materials of group IV include, for example, silicon, germanium, mixed silicon and germanium, mixed silicon and carbon, mixed silicon germanium and carbon, and the like. For example, the crystalline substrate 2 corresponds to a crystalline silicon wafer that is used in the semiconductor industry. For example, the crystalline substrate 2 can be a miscut silicon (001) substrate. A crystalline silicon wafer in the orientation (001) may reduce dislocations and results in an improved quality of subsequently grown layers on the crystalline substrate 2.

Above the crystalline substrate 2, the dielectric layer 3, for example a non-crystalline amorphous material, is formed having a thickness d. The dielectric layer 3 can be formed by known methods, as for example thermal oxidation, chemical vapor deposition (CVD), plasma enhanced CVD (PECVD), atomic layer deposition, chemical solution deposition, MOCVD, evaporation, sputtering, and other like deposition processes. Examples of such dielectric material include, but are not limited to, $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials, and combinations including multilayers thereof.

The dielectric layer 3, for example an amorphous layer, defines an opening 4. The opening 4 may be in the form of a trench having a bottom 7 and sidewalls 5, 6. The bottom 7 of the opening 4 or trench is at least partially covered with a crystalline oxygen compound. For example, this crystalline interlayer 8 can comprise a crystalline perovskite oxide material. The crystalline interlayer 8 acts as a nucleation layer, so that subsequent crystalline growth of compound material in the opening 4, for example a trench, is enhanced. The crystalline interlayer 8 acts also as a diffusion barrier between the substrate material and the second crystalline semiconductor material 9 (i.e., a potentially active compound material).

The crystalline interlayer 8 may comprise an alkaline earth metal titanate, as for example, barium titanate ($BaTiO_3$), strontium titanate ($SrTiO_3$), barium strontium titanate ($Sr_zBa_{1-z}TiO_3$), or another suitable perovskite oxide material. The crystalline interlayer 8 can include metal oxides, such as alkaline earth metal zirconates, alkaline earth metal halfnates, alkaline earth metal tantalates, alkaline earth metal ruthenates, alkaline earth metal niobates, alkaline earth metal vanadates, perovskite oxides, such as alkaline earth metal tin-based perovskites, lanthanum aluminate, lanthanum scandium oxide, and gadolinium oxide. Also, various nitrides could be used as interlayer materials, such as gallium nitride, aluminum nitrides, and boron nitride. The interlayer can be conductive, as for example, strontium ruthenate. The crystalline interlayer 8 preferably includes any combinations of the before-mentioned materials including multilayers thereof.

Preferably, the crystalline interlayer 8 includes a multilayer structure or a layer stack. This allows to combine, for example, insulating properties for separating the trenches electrically from each other and providing a suitable seed or nucleation layer for the subsequent growth of the second crystalline semiconductor material 9 (i.e., the second semiconductor layer). Isolating the openings 4 (i.e., the trenches) from each other facilitates the fabrication of electronic or other devices on the same crystalline substrate 2 (i.e., a wafer).

In embodiments, $BaTiO_3$ having piezo- and/or ferro-electric properties is used as an interlayer material. $BaTiO_3$ is MBE grown.

The opening 4, or trench, is filled with a second crystalline semiconductor material 9 (i.e., a compound material). Due to the crystalline interlayer 8, the growth of a second crystalline semiconductor material 9 that is lattice-mismatched to the substrate material is simplified. In particular, defects due to the lattice mismatch are more or less contained to the lower region in the bottom of the opening 4 or trench.

The second crystalline semiconductor material 9 may comprise a compound semiconductor which can be selected as needed for a particular semiconductor structure from any type of IIIA and VA elements (III-V semiconductor compounds), mixed III-V compounds, group II (A or B) and VIA elements (II-VI semiconductor compounds), and mixed II-VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead tenoride (PbTe), lead sulfide selenide (PbSSe), and the like. However, the crystalline material in the openings 4 or trenches can also comprise other semiconductor materials, metals, or non-metal materials which are used in the formation of semiconductor structures, devices, and/or integrated circuits.

The width w of the opening 4 is preferably smaller than the depth d of the opening 4 or trench or the height of the second crystalline semiconductor material 9. Due to the lattice mismatch at the interface when epitaxially growing the second crystalline semiconductor material 9, i.e., the compound material, on the crystalline interlayer 8, or a crystalline oxide interlayer, show crystalline defects. However, those defects occur only at the bottom 7 and stop at the opening walls 5, 6, or trench walls, in the amorphous material of the dielectric layer 3. The semiconductor structure 1, shown in FIG. 1, can be further processed for grating active electronic components in the second crystalline semiconductor material 9, i.e., the compound material.

Figure 2:
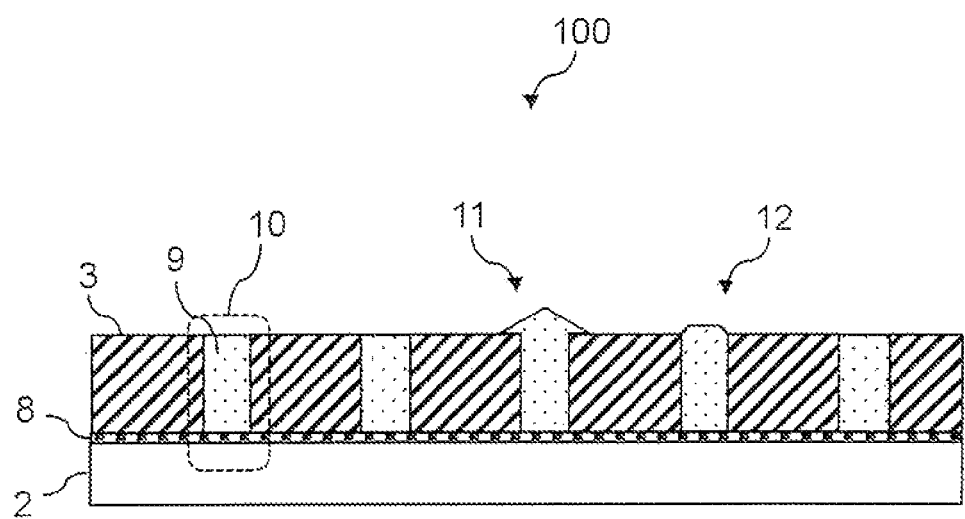
FIG. 2 shows a schematic diagram of a semiconductor wafer including embodiments of the semiconductor structure.
Figure 3:
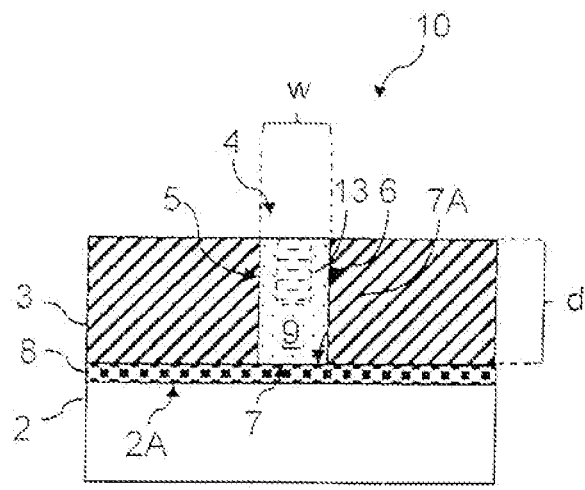
FIG. 3 shows a schematic diagram of a second embodiment of a semiconductor structure.

FIG. 2 shows a schematic diagram of a semiconductor wafer 100 including a plurality of semiconductor structures similar to the one shown in FIG. 1. FIG. 3 shows a schematic diagram of a second embodiment of such a semiconductor structure 10 which is highlighted as an insert in FIG. 2. FIG. 2 shows a semiconductor wafer 100, as for example, a conventional 300 mm crystalline substrate 2, i.e., a silicon wafer, as a substrate. The crystalline substrate 2, i.e., a substrate material, is covered with a crystalline interlayer 8, i.e., a crystalline oxygen compound, as for example, barium titanate. The silicon substrate is, for example, a Si (001) substrate.

In embodiments, a barium titanate film is epitaxially deposited onto the substrate surface 2A, and the film may range between 5 and 20 nm, for example. The semiconductor wafer 100, i.e., a wafer structure, comprises an amorphous dielectric layer, for example, a silica ($SiO_2$) layer that can be deposited by chemical vapor deposition (CVD) or another deposition technique. Other methods for forming, for example, amorphous oxide layers on the crystalline interlayer 8, can be contemplated. The dielectric layer 3, i.e., an amorphous layer, comprises openings 4 or trenches having a high aspect ratio, i.e., the depths of the respective opening 4 or trench is larger than its width. The openings 4 or trenches are filled with a compound material, as for example, a gallium arsenide compound.

The openings 4 (see FIG. 3) or trenches are patterned by any appropriate technique, as for example, by forming a mask, such as a photoresist mask, over the crystalline substrate 2, the crystalline interlayer 8, and a dielectric layer 3. The mask can be patterned to expose at least a portion of the dielectric layer 3. Next, the exposed portion of the dielectric layer 3 is removed, for example, by reactive ion etching to define the openings 4 or trenches. The trench then reaches to the surface of the crystalline interlayer 8.

Therefore, as can be seen in FIG. 3, the opening 4 or trench comprises sidewalls 5, 6 and a bottom 7 that corresponds to the crystalline oxide compound as a crystalline interlayer 8. The crystalline interlayer 8 is, for example, barium titanate having a perovskite structure. The second crystalline semiconductor material 9, i.e., a compound semiconductor material, filling the openings 4 or trenches can be formed by selective epitaxial growth in any suitable deposition system. For example, metal organic chemical vapor deposition (MOCVD), atmospheric pressure CVD, low or reduced pressure CVD, ultra-high vacuum CVD, molecular beam epitaxy (MBE), or atomic layer deposition (ALD) techniques can be employed. An epitaxial overgrowth of the openings 4 or trenches may occur as indicated in FIG. 2 for the semiconductor structures 11, 12. An optional step of planarizing the overgrown compound material can be performed.

Figure 4:
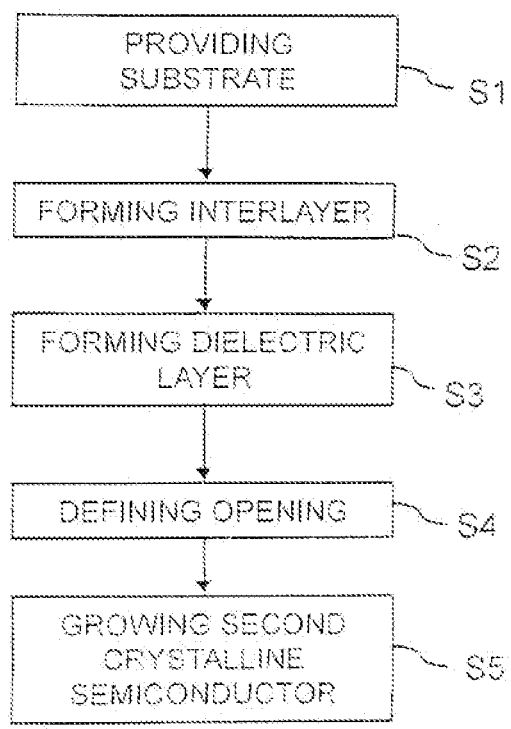
FIG. 4 shows a flow chart of method steps involved in a method for fabricating a semiconductor structure.

Turning now to FIG. 3, aspects of a method for fabricating the semiconductor structure 10 are explained. FIG. 4 shows an exemplary flowchart of method steps that are involved in fabricating a semiconductor structure 10.

For example, the silicon substrate in its (001) orientation is provided in a first step S1.

Next, on the surface 2A of the crystalline substrate 2, i.e., a semiconductor substrate, a perovskite material, such as barium titanate, is epitaxially grown as an interlayer in step S2. Investigations of the applicant have shown that perovskite-type barium titanate can be grown by molecular bean epitaxy with radio frequency sputtering in a very controlled fashion. The thickness of the interlayer is, for example, between 1 and 100 nm, preferable between 5 and 20 nm. The barium titanate retains the crystalline structure and shows piezo- and ferroelectric properties.

Next, a silica layer is deposited on the crystalline interlayer 8. This dielectric layer 3 can have a thickness between 1 and 500 nm. For example, the thickness is about 200 nm. For example, the dielectric layer is formed by a method known in the art, e.g., plasma-enhanced chemical vapor deposition in step S3.

Next, the openings 4 or trenches are patterned into the dielectric layer 3, i.e., an amorphous layer, in step S4. The trenches have a high aspect ratio, i.e., d>w.

After defining the opening 4, the second crystalline semiconductor material 9 is grown in step S5, i.e., the opening 4 or trench is filled with a second crystalline semiconductor material 9, i.e., a epitaxially grown compound material, such as gallium arsenide. The second crystalline semiconductor material 9, i.e., a gallium arsenide material, nucleates as islands on the crystalline interlayer 8, i.e., a perovskite material, at the bottom of the trench, i.e., at the surface 7A, islands of gallium arsenide grow in a Volmer-Weber mode and coalesce to a film. Any defects that occur during the crystal growth essentially propagate planary and stop at the boundary to the sidewalls 5, 6 at the dielectric layer 3, i.e., an amorphous material. Hence, the crystalline interlayer, i.e., a perovskite layer or interlayer, acts as an additional trapping layer for crystal defects due to lattice mismatches as well as a diffusion barrier between the crystalline substrate 2, i.e., a silicon material, and the second crystalline semiconductor material 9, i.e., an active compound material, in the opening 4 or trench. The epitaxial growth of the gallium arsenide or any other compound material is, for example, done by CVD with an RF heating. The crystalline defects, such as threading dislocation, stacking false twin boundaries, and anti-boundaries are substantially eliminated to the upper portion of the material in the opening 4 or trench. A clean and high-quality crystalline material is obtained that can be further processed for fabricating, for example, photonic or electronic devices. This is indicated in FIG. 3 as box 13.

The disclosed semiconductor structures can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input device, and a central processor.

What is claimed is:

1. A semiconductor structure comprising:
   a substrate comprising a first crystalline semiconductor material;
   a dielectric layer, above the substrate, defining an opening, wherein the opening includes non-crystalline sidewalls;
   a second crystalline semiconductor material at least partially filling the opening;
   a crystalline interlayer between the substrate and the second crystalline semiconductor material, wherein the non-crystalline sidewalls extend continuously from an uppermost surface of the substrate to above the crystalline interlayer all the way to an uppermost surface of the second crystalline semiconductor material, and wherein the uppermost surface of the second crystalline semiconductor material is coplanar with an uppermost surface of the opening
   wherein:
   the first crystalline semiconductor material and the second crystalline semiconductor material are lattice mismatched; and
   the crystalline interlayer comprises an oxygen compound.

2. The semiconductor structure of claim 1, wherein the dielectric layer covers the substrate at least partially.

3. The semiconductor structure of claim 1, wherein the crystalline interlayer is a crystalline oxide layer.

4. The semiconductor structure of claim 1, wherein the opening further comprises a bottom, and the bottom corresponds to a surface of the substrate.

5. The semiconductor structure of claim 1, wherein an aspect ratio of a depth (d) to a width (w) of the opening is at least one.

6. The semiconductor structure of claim 1, the opening comprises a trench.

7. The semiconductor structure of claim 1, wherein the first crystalline semiconductor material and the second crystalline semiconductor material are crystalline semiconductors having a lattice mismatch to another.

8. The semiconductor structure of claim 1, wherein the second crystalline semiconductor material is one or more of the following: a III-V compound semiconductor material, a II-VI compound semiconductor material, or a IV-IV compound semiconductor material.

9. The semiconductor structure of claim 1, wherein the crystalline interlayer comprises a multi-layer structure.

10. The semiconductor structure of claim 1, wherein the crystalline interlayer comprises a diffusion barrier layer.

11. The semiconductor structure of claim 1, wherein the crystalline interlayer has metallic conductivity.

12. The semiconductor structure of claim 1, wherein the crystalline interlayer is one or more of the following: a ferroelectric, a ferromagnetic, or a piezoelectric material.

13. The semiconductor structure of claim 1, wherein the crystalline interlayer comprises an insulating material.

14. The semiconductor structure of claim 1, wherein the substrate comprising the first crystalline semiconductor material includes a silicon substrate oriented along a direction.

15. A wafer structure comprising:
    a plurality of semiconductor structures each comprising:
    a substrate comprising a first crystalline semiconductor material;
    a dielectric layer, above the substrate, defining an opening, wherein the opening includes non-crystalline sidewalls;
    a second crystalline semiconductor material filling the opening;
    a crystalline interlayer between the substrate and the second crystalline semiconductor material, wherein the non-crystalline sidewalls extend continuously from an uppermost surface of the crystalline interlayer all the way to an uppermost surface of the second crystalline semiconductor material, and wherein the uppermost surface of the second crystalline semiconductor material is coplanar with an uppermost surface of the opening;
    wherein:
    the first crystalline semiconductor material and the second crystalline semiconductor material are lattice mismatched; and
    the crystalline interlayer comprises an oxygen compound.

* * * * *